United States Patent [19]

Miyazaki et al.

[11] Patent Number: 5,120,573
[45] Date of Patent: Jun. 9, 1992

[54] PROCESS FOR PRODUCING METAL/POLYIMIDE COMPOSITE ARTICLE

[75] Inventors: Kunio Miyazaki; Osamu Miura, both of Hitachi; Ryuji Watanabe, Ibaraki; Yukio Ookoshi, Mito; Toshio Miyamoto, Takasaki; Mikio Aizawa, Fukaya; Kazumasa Igarashi, Suzuka; Amane Mochizuki, Fukaya, all of Japan

[73] Assignees: Hitachi, Ltd., Osaka; Nitto Denko Corporation, Tokyo, both of Japan

[21] Appl. No.: 416,280

[22] Filed: Sep. 27, 1989

[30] Foreign Application Priority Data

Sep. 28, 1988 [JP] Japan ................. 63-240998

[51] Int. Cl.$^5$ ........................................ C23C 26/00
[52] U.S. Cl. ...................... 427/96; 427/407.1; 427/409; 427/404
[58] Field of Search ............ 427/96, 407.1, 409, 427/404

[56] References Cited

U.S. PATENT DOCUMENTS

| 4,347,306 | 8/1982 | Takeda | 427/96 |
| 4,654,223 | 3/1987 | Araps | 427/96 |
| 4,656,050 | 4/1987 | Araps | 427/96 |
| 4,699,803 | 10/1987 | Araps | 427/96 |
| 4,910,293 | 3/1990 | Uekita | 427/402 |
| 4,943,471 | 7/1990 | Uekita | 428/411.1 |

FOREIGN PATENT DOCUMENTS

| 143531 | 6/1985 | European Pat. Off. . |
| 247358 | 12/1987 | European Pat. Off. . |
| 251828 | 1/1988 | European Pat. Off. . |
| 2212139 | 9/1987 | Japan | 427/96 |
| 2212140 | 9/1987 | Japan | 427/96 |

Primary Examiner—Michael Lusignan
Assistant Examiner—Vi Duong Dang
Attorney, Agent, or Firm—Antonelli, Terry, & Stout & Kraus

[57] ABSTRACT

The present invention provides a process for producing a metal/polyimide composite article such as high-density wiring boards. This metal/polyimide composite article is produced by a method which comprises coating a polyamic acid alkyl ester represented by the following formula on a metallic film and curing it:

$$-NH-Ar^1-NHCO\underset{R_1-O-CO}{\overset{}{\diagdown}}\underset{}{\overset{Ar^2}{\diagup}}\underset{CO-O-R_2}{\overset{CO-}{\diagup}}$$

wherein $R_1$ and $R_2$ which may be identical or different each represents an organic group of 1 or more carbon atoms.

9 Claims, 1 Drawing Sheet

PROCESS FOR PRODUCING METAL/POLYIMIDE COMPOSITE ARTICLE

BACKGROUND OF THE INVENTION

The present invention relates to a wiring board which exhibits a very small delay time for use in large sized to middle or small sized computers and flexible printed boards which are essential for miniaturization of electronic parts.

Hitherto, there have been used multi-layer wiring boards comprising an epoxy or maleimide resin-glass cloth laminate and copper foil or an alumina/tungsten multi-layer wiring boards. However, in the former case, there are limitations in production method and materials and fine wire width of less than 30 μm cannot be obtained and in the latter case, tungsten of high heat resistance with high resistivity must be used because ceramics are high in dielectric constant and a step of very high temperature is required for production. Thus, wiring boards of high performance have been demanded as future high speed and high density wiring boards to be used in place of the above conventional wiring boards. The first possible one is a copper/polyimide wiring board. This is produced by forming polyimide of low dielectric constant and copper of low resistivity on a silicon wafer or ceramic substrate by the same fining process as used for production of semiconductor wiring. By this method, it can be expected that wiring board of high performance is obtained. As such conventional technique, there is a polyimide laminate material disclosed in Japanese Patent Kokai No. 57-181857.

However, there is the problem that when polyamic acid which is a polyimide precursor is heated and cured in contact with copper or silver at higher than 300° C., a heat decomposition reaction occur which cannot be considered to occur in view of the heat resistance of polyimide per se. For example, it has been known that when polyamic acid varnish is coated on a film of copper and heat cured, distinct discoloration is recognized at higher than 300° C. and the film becomes mechanically very brittle. Similar phenomena are recognized to occur at production of flexible printed board or curing of electrically conductive silver paste. This problem is especially conspicuous for copper and silver and nearly no problem is seen in aluminum, titanium, nickel and chromium.

Up to now, in forming an imidized film in contact with a metal, the following methods have been employed, namely, a method of forming a metallic film such as of inert chromium or an inert film of $SiO_2$ or $Si_3N_4$ and coating thereon a polyamic acid precursor varnish and heating and curing the varnish and a method of heating and curing the varnish in a reducing atmosphere such as hydrogen when the varnish is allowed to directly contact with the metal. These methods suffer from severe problems such as much increase in the number of steps and increase in running cost.

Taking the hint from the fact that even if a film of such metal is formed on a polyimide film and heater, substantially no adverse effect is given to the polyimide film, the inventors coated a varnish of polyimide on a metallic film and heated and cured the varnish and as a result have found that no deterioration of polyimide occurs. However, this method still has the problems that since solubility of polyimide is very poor, cresol type solvents which are harmful to human bodies must be used and only special solvents can be used.

The inventors have carefully studied chemical reaction of polyimide precursor and metal which takes place in production of a metal/polyimide composite which includes a step of thermal imidization of polyimide precursor in contact with the metal. As a result, it has been elucidated that the metal is dissolved in the presence of carboxylic acid groups of polyamic acid and subsequently when it is exposed to high temperature, imide ring is decomposed by the metal and simultaneously particulate metal oxide is precipitated in the polyimide film. Furthermore, it has also been found that similar phenomenon is also recognized for polyimide precursor having sulfonic acid group and presence of acidic functional group causes dissolution of metal.

SUMMARY OF THE INVENTION

An object of the present invention is to provide a process for producing metal/polyimide composite article of high reliability which is prevented from heat deterioration of polyimide film due to metallic ions of a metallic film or the like with which the polyimide film is contact.

It has been found that if polyamic acid whose carboxylic acid is masked with ester groups such as alkyl ester is used, no problem occurs. This polyamic acid whose carboxylic acid is esterified can be obtained by, for example, reacting an acid anhydride with an alcohol, then converting the product to an acid chloride with thionyl chloride and then further reacting the acid chloride with a diamine or by polycondensation of a half ester of a tetracarboxylic acid and a diamine with a dehydrating agent.

The present invention provides a process for producing a metal/polyimide composite article comprising: providing a precursor of a polyimide in contact with an electroconductive solid metal material; and heating the precursor until it turns into the polyimide, wherein the precursor is a polyamic acid ester represented by the following general formula:

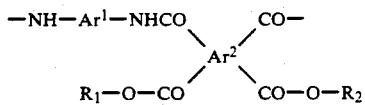

where $R_1$ and $R_2$ are each the same or different alkyl group having carbon atoms of one or more, $Ar^1$ is a bivalent aromatic group, and $Ar^2$ is a tetravalent aromatic group.

The present invention further provides a process for producing a printed circuit board comprising:
forming a copper film on an electrically insulating substrate;
coating a precursor of a polyimide on said copper film; and
heating the precursor until it turns into the polyimide, wherein the precursor is a polyamic acid ester represented by the following general formula:

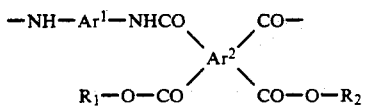

where $R_1$, $R_2$, $Ar^2$ have the same definition mentioned above.

According to one aspect of the present invention, there is provided a process for producing a metal/polyimide composition comprising:

providing a homogeneous mixture of a precursor of polyimide, powder of an electroconductive solid metallic material and an organic solvent for dissolving the precursor; and heating the precursor until it turns into the polyimide, wherein the precursor is a polyamic acid ester represented by the following general formula:

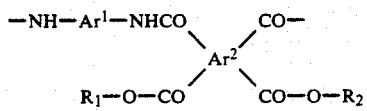

where $R_1$, $R_2$, $Ar^1$ and $Ar^2$ have the same definition mentioned above.

Still another aspect of the present invention provides a process for producing a multi-layered printed circuit board, which comprises the steps of:

a first step for forming a circuit pattern of copper film on an electrically insulating substrate;

a second step for coating varnish of a precursor of a polyimide on said pattern;

a third step for heating the varnish until the precursor turns into the polyimide;

a fourth step for patterning the polyimide to form through-holes therein; and a fifth step for forming a circuit pattern of copper on said patterned polyimide; said second step through said fifth step being repeated until a desired number of layers is obtained, wherein the precursor is a polyamic acid ester represented by the following general formula:

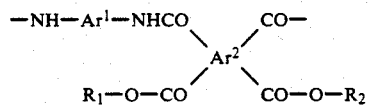

where $R_1$, $R_2$, $Ar^1$ and $Ar^2$ have the same definition mentioned above.

The number of the carbon atoms of each of the $R_1$ and $R_2$ is preferably 1 to 20.

DESCRIPTION OF THE INVENTION

Figure 1:
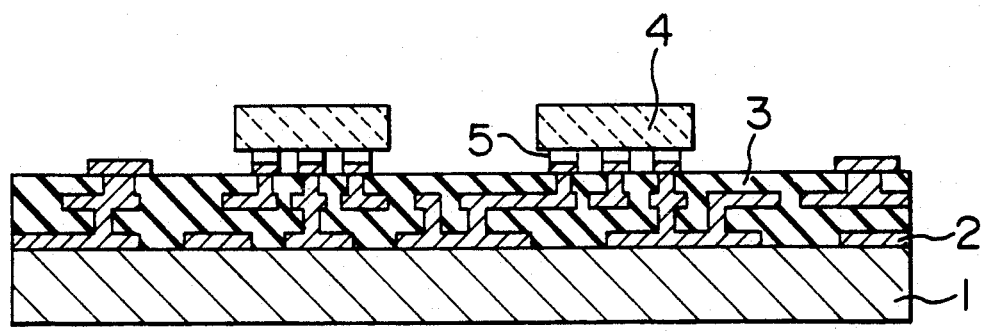
FIG. 1 illustrates a high-density wiring board which is one specific example of the present invention.

The present invention is concerned with a process for producing a composite article comprising metal and polyimide which is produced by a method characterized in that a precursor of polyimide is substantially free from acidic functional group such as carboxyl group, sulfone group, or the like.

The present invention is characterized by employing a polyamic acid ester represented by the formula:

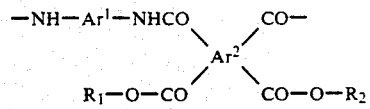

where $R_1$ and $R_2$ are each the same or different group having carbon atoms of one or more, $Ar^1$ is a bivalent aromatic group, and $Ar^2$ is a tetravalent aromatic group.

The polyamic acid ester varnish used in the present invention can be obtained by homopolymerizing an aminodicarboxylic acid ester to obtain a polyamic acid or reacting an aromatic diamine with a tetracarboxylic acid derivative to obtain a polyamic acid and then heating the resulting polyamic acid in an organic solvent containing alcohol to esterify the polyamic acid, or reacting the polyamic acid with a dehydrating agent. The tetra-carboxylic acids and their derivative includes ester, acid anhydride and acid chloride. Acid chloride is preferred from the point of preparation.

The reaction for preparation of polyamic acids is generally carried out at $-20°-200°$ C. in solvents such as N-methylpyrrolidone (NMP), dimethylformamide (DMF), dimethylacetamide (DMAC), dimethylsulfoxide (DMSO), dimethyl sulfate, sulforan, butyl lactone, cresol, phenol, halogenated phenol, cyclohexanone, dioxane, tetrahydrofuran, and acetophenone.

Examples of the aminodicarboxylic acids and their derivatives used in the present invention includes 4-aminophthalic acid, 4-amino-5-methylphthalic acid, 4-(p-anilino)-phthalic acid, 4-(3,5-dimethyl-4-anilino)-phthalic acid and esters, acid anhydrides and acid chlorides thereof.

Examples of the aromatic diamines used in the present invention to provide the vibalent aromatic group $Ar^1$ are p-phenylenediamine (p-PDA) 2,5-diaminotoluene, 2,5-diaminoxylene, diaminodurene-(2,3,5,6-tetramethylphenylenediamine), 2,5-diamino-benzotrifluoride, 2,5-diaminoanisole, 2,5-diaminoaceto-phenone, 2,5-diaminobenzophenone, 2,5-diaminodiphenyl, 2,5-diaminofluorobenzene, benzidine, o-tolidine (o-TLD), m-tolidine, 3,3′,5,5′-tetramethylbenzidine, 3,3′-dimethoxybenzidine, 3,3′-di(trifluoromethyl)benzidine, 3,3′-diacetylbenzidine, 3,3′-difluorobenzidine, octafluoro-benzidine, 4,4″-diaminoterphenyl DATP), and 4,4‴-diamino-quaterphenyl which have linear conformations, and m-phenylenediamine, 4,4′-diaminodiphenylmethane, 1,2-bis(anilino)ethane, 4,4′-diaminodiphenyl ether (DDE), diaminodiphenylsulfone, 2,2-bis(p-aminophenyl)propane, 2,2-bis(p-aminophenyl)hexafluoropropane, 3,3′-dimethyl-4,4′-diaminodiphenyl ether, 3,3′-dimethyl-4,4′-diaminodiphenylmethane, diaminotoleuen, diaminobenzotrifluoride, 1,4-bis(p-aminophenoxy)benzene, 4,4-bis(p-aminophenoxy)-biphenyl, 2,2-bis{4-(p-aminophenoxy)-phenyl]propane (DAPP), 2,2-bis{4-(m-aminophenoxy)-phenyl}propane, 2,2-bis{4-(p-aminophenoxy)phenyl} hexafluoropropane (DAPFP), 2,2-bis{4-(m-aminophenoxy)phenyl}hexa-fluoropropane, 2,2-bis{4-(p-aminophenoxy)-3,5-dimethyl-phenyl}hexafluoropropane, 2,2-bis{4-(p-aminophenoxy)-3,5-ditrifluoromethylphenyl}hexafluoropropane, p-bis(4-amino-2-trifluoromethylphenoxy)benzene, 4,4′-bis(4-amino-2-trifluoromethylphenoxy)biphenyl, 4,4′-bis(4-amino-3-trifluoromethylphenoxy)biphenyl, 4,4′-bis(4-amino-2-trifluoromethylphenoxy)biphenylsulfone, 4,4′-bis(3-amino-5-trifluoromethylphenoxy)biphenylsulfone, 2,2- bis{4-(p-amino-3-trifluoromethylphenoxy)phenyl}-hexafluoropropane, diaminoanthraquinone, 4,4-bis-(3-aminophenoxyphenyl)diphenylsulfone, 1,3-bis(anilino)-hexafluoropropane, 1,4-bis(anilino)octafluorobutane, 1,5-bis(anilino)decafluoropentane and 1,7-bis(anilino)-tetradecafluoroheptane.

As the tetracarboxylic acids and their derivatives used in the present invention to provide the tetravelent aromatic group $Ar^2$, mention may be made of, for example, pyromellitic acid (PMDA), methylpyromellitic acid, dimethylpyromellitic acid, di(trifluoromethyl)-pyromellitic acid, 3,3',4,4'-biphenyl-tetracarboxylic acid (s-BPDA), 5,5'-dimethyl-3,3',4,4'-biphenyltetracarboxylic acid, p-(3,4-dicarboxyphenyl)-benzene, 2,3,3',4'-tetracarboxydiphenyl, 3,3',4,4'-tetracarboxydiphenyl ether, 2,3,3',4'-tetracarboxy-diphenylether, 3,3',4,4'-tetracarboxybenzophenone (BTDA), 2,3,3',4'-tetracarboxybenzophenone, 2,3,6,7-tetra-carboxynaphthalene, 1,4,5,7-tetracarboxynaphthalene, 1,2,5,6-tetracarboxynaphthalene, 3,3',4,4'-tetra-carboxydiphenylmethane, 2,3,3',4'-tetracarboxydiphenylmethane, 2,2-bis(3,4-dicarboxyphenyl)propane, 2,2-bis(3,4-dicarboxyphenyl)hexafluoropropane, 3,3',4,4'-tetracarboxydiphenylsulfone, 3,4,9,10-tetra-carboxyperillene, 2,2-bis{4-(3,4-dicarboxyphenoxy)-phenyl}propane, 2,2-bis{4-(3,4-dicarboxyphenoxy)-phenyl}hexafluoropropane, butanetetracarboxylic acid, and cyclopentanetetracarboxylic acid. Acid anhydrides, acid chlorides and esters may also be used.

Representative alkyl esters among esters of polyamic acid of the present invention can be obtained by reacting the above acid anhydride with an alcohol, then reacting the product with a chlorinating agent such as thionyl chloride to once obtain a polyamic acid chloride and thereafter reacting the chloride with a diamine or by polycondensation of an esterified tetracarboxylic acid with a diamine using a dehydrating agent.

The polyamic acid esters of the present invention have such merits as very excellent solubility, low viscosity of varnish and excellent stability.

Coating film can be formed from polyamic acid ester varnish by generally employed methods such as spin coating method. In formation of film, preferably the polyamic acid ester is first dried at 50°-250° C. and then imidized by heating to 250°-400° C.

In the present invention, adhesion of polyimide to various substrates is important. It is preferred to roughen the surface of inorganic materials or to treat the surface with a silane coupling agent, titanate coupling agent, aluminum alcoholate, aluminum chelate, zirconium chelate, aluminum acetylacetonate. These surface treating agents may be added to polyimide. Alternatively, diamines having siloxane skeleton or tetracarboxylic acid dianhydrides may be copolymeirzed therewith.

In the present invention, when polyimide skeleton has a linear conformation, heat expansion coefficient of the film is very small and modulus thereof increases, but it is also possible to decrease heat expansion coefficient, increase modulus and control flowability by incorporating therein powders, fibers, chopped strands or the like of inorganic materials, organic materials or metals.

According to the present invention, it has been ascertained that when a polyimide film is formed in contact with copper or silver, the metal is dissolved in carboxylic acid of polyamic acid which is a precursor of polyimide. Metal ions dissolved from the metallic substrate act as a catalyst for thermal decomposition of polyimide under high temperature conditions for curing, but the masked polyamic acid used in the present invention prevents dissolution of metal, because of no free carboxylic acid groups. As a result, deterioration of polyimide film can be prevented.

Figure 2:
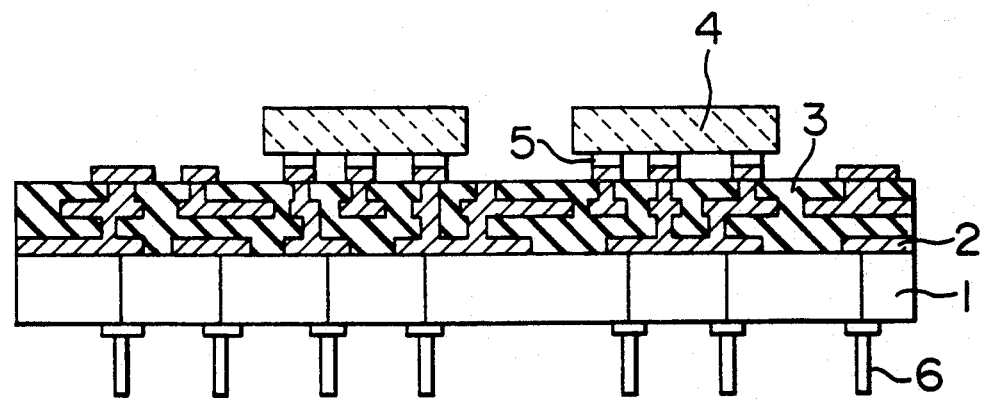
FIG. 2 illustrates an example of application of the present invention to a package substrate for multi-chip module.

The present invention is applied to production of multi-chip modules shown in FIGS. 1 and 2. A pattern 2 of copper film is formed on an insulating substrate or circuit board by vacuum evaporation. Patterning of the copper film is performed by chemical etching or dry etching which are well known in the art.

A varnish of a precursor (i.e. a polyamic acid ester) of a polyimide is coated on the patterned copper film 2, then the coating of the precursor is dried and heated to effect imidization of precursor. The polyimide film is then patterned to form one or more through-holes by etching with hydrazine or by dry etching by means of an ion milling apparatus. Another copper film is deposited on the patterned polyimide film so that the lower copper film and upper copper film are electrically connected. Then, the upper copper film is patterned thereby to form desired circuits. After the desired number of layers of copper film and polyimide film is formed, semiconductor chips 4 are bonded to the patterned copper film through controlled collupse bonding (CCDB) 5. CCB 5.

FIG. 2 shows an LSI package of ceramic pin grid array type in which the multi-layered circuit board comprising 2 and 3 is produced by the same manner as in FIG. 1. Number 6 represents pins.

EXAMPLE 1 s-BPDA was reacted with methanol at a molar ratio of 1:2 in N-2-methylpyrrolidone (abbreviated to "NMP" hereinafter) to obtain a half-esterified product. This was reacted with thionyl chloride by conventional method to obtain an acid chloride. Thereto were added triethylamine and DDE and reaction was allowed to proceed for 2 hours at room temperature and further for 2 hours at 50° C. The reaction mixture was poured in a large amount of water to obtain the desired polyamic acid alkyl ester.

This polyamic acid alkyl ester was dried and then again dissolved in NMP to produce a 15% varnish. This polyamic acid alkyl ester varnish was spin coated on the surface of a silicon wafer having thereon a copper thin film vapor-deposited to form a film of 10 μm thick. Heating conditions for imidization were heating at 100° C. for 30 minutes, heating from 100° C. to 350° C. over 1 hour and keeping at that temperature for 30 minutes. The heating atmosphere was air. This polyimide film was peeled from silicon wafer and copper content in this film, color, heat decomposition temperature and tensile strength were measured to find that this film contained only 0.05% (atomic-absorption method) of copper, color of the film was yellowish orange and this was nearly the same as the film formed on inert $SiO_2$ film. Decomposition temperature in air was 450° C. and tensile strength was 105 MPa and breaking extension was 35%, namely, this was very excellent film.

EXAMPLE 2

BTDA was reacted with ethanol at a molar ratio of 1:2 in NMP to obtain a half-esterified product. This was mixed with p-PDA and thereto was added dicyclohexylcarbodiimide in an amount of 1.2 time the mol of amino group and polycondensation was carried out.

The reaction mixture was poured in a large amount of water to obtain the desired polyamic acid alkyl ester.

This polyamic acid alkyl ester was dried and then again dissolved in NMP to produce a 15% varnish. This polyamic acid alkyl ester varnish was spin coated on the surface a silicon wafer having a copper thin film vapor-deposited on the surface in the same manner as in Example 1 to form a film of 10 μm thick. Heating conditions for imidization were the same as in Example 1. This polyimide film was peeled from silicon wafer by etching the copper foil and copper content in this film, color, heat decomposition temperature and tensile strength were measured. As a result, this film contained only 0.03% of copper, and color of the film was yellowish orange and this was nearly the same as the film formed on inert SiO₂ film. Decomposition temperature in air of this film was 450° C. and tensile strength was 250 MPa and breaking extension was 13%, namely, this film had very excellent heat resistance and mechanical properties.

EXAMPLE 3

The polyamic acid alkyl ester varnish prepared in Example 2 was spin coated on the surface of a silicon wafer having a silver thin film vapor-deposited thereon to form a film of 10 μm thick. Heating conditions for imidization were the same as in Example 1 and the atmosphere was air. This polyimide film was peeled from silicon wafer and content of silver in this film and color, heat decomposition temperature and tensile strength were measured. This film contained only 0.011% (atomic-absorption method) of silver and had yellowish orange color which was nearly the same as that of the film formed on an inert SiO₂ film. Decomposition temperature of this film in air was 455° C., tensile strength was 260 MPa and breaking extension was 19%, namely, this had very excellent heat resistance and mechanical properties.

COMPARATIVE EXAMPLE 1

DAPP was reacted with BTDA in cresol at room temperature to once produce polyamic acid and then reaction was allowed to proceed at 150° C. for 3 hours to obtain an imidated varnish.

This imidized varnish was spin coated on the surface a silicon wafer having a copper thin film vapor-deposited on to form a film of 10 μm thick. Heating conditions for imidization were heating at 150° C. for 30 minutes, heating from 150° C. to 350° C. over 1 hour and keeping at that temperature for 30 minutes. Atmosphere was air. This polyimide film was peeled from silicon wafer and copper content in this film, color, heat decomposition temperature and tensile strength were measured. As a result, this film contained only 0.03% of copper, and color of the film was yellowish orange which was nearly the same as that of the film formed on inert SiO₂ film (Comparative Example 2). Decomposition temperature in air of this film was 410° C. and tensile strength was 120 MPa and breaking extension was 30%, namely, this film had very excellent heat resistance and mechanical properties.

Furthermore, this was dipped in an etching solution for copper for about 5 hours and then heat decomposition temperature and mechanical properties of the film were measured to obtain nearly the same values as those of the film which was not dipped in the etching solution and thus the film was found to be chemically very stable.

However, the film was considerably inferior to that of Comparative Example 2 in heat resistance and mechanical properties. This is not due to deterioration of polyimide, but when solubility in solvent is enhanced, molecule skeleton becomes flexible and the film becomes inferior in heat resistance and mechanical properties.

COMPARATIVE EXAMPLE 2

A 15% NMP solution of polyamic acid obtained from p-PDA and s-BPDA was spin coated on the surface of a silicon wafer on which silicon oxide film had been formed, thereby to form a film of 10 μm thick. Heating conditions for imidization were the same as in Example 1. This film was peeled from silicon wafer and color, heat decomposition temperature and tensile strength were measured. As a result, this film had yellowish orange color. Decomposition temperature of this film in air was 510° C., tensile strength was 350 MPa and breaking extension was 25%, namely, this had very excellent heat resistance and mechanical properties. Copper content in this film was naturally very low and less than 0.0003%.

Furthermore, the film was dipped in an etching solution for copper for about 5 hours and thereafter heat decomposition temperature and mechanical properties of the film were measured to obtain nearly the same values as those of the film which was not dipped in the etching solution and thus this film was chemically very stable.

It can be seen from the above results that if imidization is conducted without contacting with copper or silver, the film has very excellent properties.

COMPARATIVE EXAMPLE 3

In the same manner as in Example 1, a copper thin film was vapor deposited on a silicon wafer, a pattern was formed by etching, and thereon was coated the same polyamic acid varnish as used in Comparative Example 2 and imidized with heating under the same conditions as in Comparative Example 2. As a result, discoloration of the polyimide film on the copper pattern to blackish brown occurred and when the film was peeled, it was torn off from the discolored portion of the copper pattern. Separately, copper was vapor deposited on a silicon wafer as above and then, thereon polyamic acid varnish was coated without forming pattern and was imidized by heating. Thereafter, this was dipped in an etching solution for copper and the film was peeled therefrom. Content of copper in this film was very high, namely, 0.3%. This film had a heat decomposition starting temperature of 330° C. and thus was inferior in heat resistance by nearly 200° C. to the film formed on an inert film and besides film strength and breaking extension were much deteriorated, namely, 150 MPA and 3%, respectively. These seem to be caused by dissolution of copper due to the presence of carboxylic acid in the polyamic acid which is a polyimide precursor and deterioration of imide ring due to oxidation with copper in the film. It can be clearly seen from comparison of Comparative Examples 1 and 2 that when polyamic acid is imidized by heating in contact with copper, he%t resistance is sharply reduced by copper.

COMPARATIVE EXAMPLE 4

In place of copper used in Comparative Example 2, silver film was formed on a silicon wafer by vapor deposition and the same polyamic acid varnish as in Comparative Example 2 was coated thereon and imidized by heating. The polyimide film peeled therefrom had a heat decomposition starting temperature of 400° C. which was better than when the film was formed on a copper film, but was inferior in heat resistance by nearly 100° C. to the film formed on an inert film and besides the film was much inferior in film strength and breaking extension, namely, 220 KPa and 6%, respectively. These seem to be caused by dissolution of silver due to the presence of carboxylic acid in the polyamic acid which is a polyimide precursor and deterioration of imide ring by oxidation with silver in the film. Heat resistance of polyimide was considerably decreased in the case of silver as in the case of copper.

COMPARATIVE EXAMPLE 5

The same polyamic acid varnish as used in Comparative Example 2 was coated on a silicon wafer on which copper thin film was vapor deposited and imidated by heating in the same manner as in Comparative Example 2 except that atmosphere for curing by heating was not air, but a nitrogen gas containing a small amount of hydrogen, namely, slightly reducing atmosphere. As a result, no change was seen in polyimide film. Heat decomposition starting temperature of the polyimide film peeled by removing copper by etching was 500° C., namely, heat decomposition characteristic of this film was markedly higher than the film imidated by heating in air and nearly the same as the film cured on an inert film. Besides, film strength and breaking extension were 350 MPa and 21%, respectively and were somewhat inferior to those of the polyimide film formed on $SiO_2$ film, but it was recognized that the film was subject to substantially no influence of copper. It seems that copper was dissolved due to the presence of carboxylic acid in polyamic acid which is a polyimide precursor, but copper in the film became inert by the heat treatment in the reducing atmosphere.

What is claimed is:

1. A process for producing a printed circuit board comprising:
    forming a copper film on an electrically insulating substrate;
    forming a precursor of a polyimide directly on said copper film; and heating the precursor until the precursor converts into a polyimide,
wherein the precursor is a polyamic acid alkyl ester represented by the following general formula:

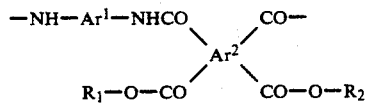

wherein $R_1$ and $R_2$ are each the same or different alkyl group having carbon atoms of one or more, $Ar^1$ is a bivalent aromatic group, and $Ar^2$ is a tetravalent aromatic group.

2. The process for producing a printed circuit board according to claim 1, wherein the number of carbon atoms of each of the $R_1$ and $R_2$ is 1 to 20.

3. A process for producing a metal/polyimide composition comprising:
    providing a homogeneous mixture of a precursor of polyimide, powders of an electroconductive solid metallic material of copper or silver and an organic solvent for dissolving the precursor; and
    heating the precursor until the precursor converts into the polyimide,
wherein the precursor is a polyamic acid alkyl ester represented by the following general formula:

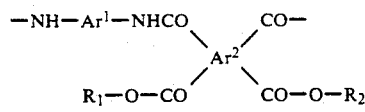

wherein $R_1$ and $R_2$ are each the same or different alkyl group having carbon atoms of one or more, $Ar^1$ is a bivalent aromatic group, and $Ar^2$ is a tetravalent aromatic group.

4. The process for producing a metal/polyimide composition according to claim 3, wherein the number of carbon atoms of each of the $R_1$ and $R_2$ is 1 to 20.

5. A process for producing a multi-layered printed circuit board, which comprises the steps of:
    a first step for forming a circuit pattern of copper film on an electrically insulating substrate;
    a second step for coating varnish of a precursor of a polyimide directly on said pattern;
    a third step for heating the varnish until the precursor converts into the polyimide;
    a fourth step for patterning the polyimide to form through-holes therein; and
    a fifth step for forming a circuit pattern of copper on said patterned polyimide;
said second step through said fifth step being repeated until a desired number of layers is obtained, wherein the precursor is a polyamic acid alkyl ester represented by the following general formula:

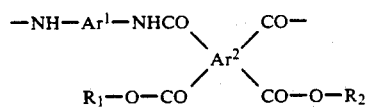

$R_1$ and $R_2$ are each the same or different alkyl group having carbon atoms of one or more, $Ar^1$ is a bivalent aromatic group, and $Ar^2$ is a tetravalent aromatic group.

6. The process for producing a multi-layered printed circuit board according to claim 5, wherein the number of carbon atoms of each of the $R_1$ and $R_2$ is 1 to 20.

7. A process for producing a thin film multi-layered wiring board comprising the steps of:
    (a) forming a metallic thin film of copper or silver on a substrate,
    (b) patterning the metallic film to form a desired circuit pattern and exposed surfaces of the substrate,
    (c) coating a solution of a precursor of a polyimide on the pattern of the metallic film and the exposed surfaces,
    (d) heating the coating of the precursor to convert it into the polyimide,
    (e) forming through-holes in the polyimide film to expose a desired part of the pattern for electric connection,
    (f) forming patterned electrodes in electric connection with the pattern through the through-holes,
    (g) coating a solution of a precursor of a polyimide on the patterned electrodes and the polyimide film,
    (h) heating the coating of the precursor to convert it into the polyimide, and (i) forming through-holes in the polyimide film to expose a desired part of the pattern for electric connection, wherein the precursor is a polyamic acid alkyl ester having recurring unit represented by the following general formula:

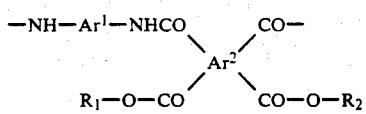

wherein $R_1$ and $R_2$ are each the same or different alkyl group having carbon atoms of one or more, $Ar^1$ is a bivalent aromatic group, and $Ar^2$ is a tetravelent aromatic group.

8. The process for producing a thin film multi-layered wiring board according to claim 7, wherein the number of carbon atoms of each of the $R_1$ and $R_2$ is 1 to 20.

9. A process for producing a thin film multi-layered wiring board comprising the steps of:
 (a) forming a metallic thin film of copper or silver on a substrate,
 (b) patterning the metallic film to form a desired circuit pattern and exposed surfaces of the substrate,
 (c) coating a solution of a precursor of a polyimide on the pattern of the metallic film and the exposed surfaces,
 (d) heating the coating of the precursor to convert it into the polyimide,
 (e) forming through-holes in the polyimide film to expose a desired part of the pattern for electric connection,
 (f) forming patterned electrodes in electric connection with the pattern through the through-holes,
 (g) coating a solution of a precursor of a polyimide on the patterned electrodes and the polyimide film,
 (h) heating the coating of the precursor to convert it into the polyimide,
 (i) forming through-holes in the polyimide film to expose a desired part of the pattern for electric connection, and
 (j) repeating steps (g) to (i) until a desired number of layers is obtained, wherein the precursor is a polyamic acid alkyl ester having recurring unit represented by the following general formula:

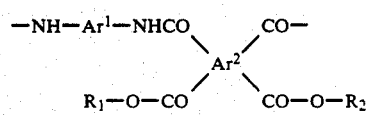

wherein $R_1$ and $R_2$ are each the same or different alkyl group having carbon atoms of one or more, $Ar^1$ is a bivalent aromatic group, and $Ar^2$ is a tetravelent aromatic group.

* * * * *